(12) United States Patent
Ono et al.

(10) Patent No.: US 7,090,502 B2
(45) Date of Patent: Aug. 15, 2006

(54) BOARD CONNECTING COMPONENT AND THREE-DIMENSIONAL CONNECTING STRUCTURE USING THEREOF

(75) Inventors: Masahiro Ono, Osaka (JP); Shigeru Kondou, Osaka (JP); Kazuhiro Nishikawa, Osaka (JP); Kazuto Nishida, Osaka (JP); Hiroyuki Inoue, Kyoto (JP); Osamu Miyazaki, Osaka (JP); Hiroshi Takeda, Kyoto (JP); Tsuneyuki Ejima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/118,403

(22) Filed: May 2, 2005

(65) Prior Publication Data

US 2005/0260867 A1 Nov. 24, 2005

(30) Foreign Application Priority Data

May 21, 2004 (JP) ............................. 2004-151535

(51) Int. Cl.
*H01R 12/00* (2006.01)
*H05K 1/00* (2006.01)
(52) U.S. Cl. ...................................... 439/65; 439/736
(58) Field of Classification Search .................. 439/65, 439/74, 66, 732
See application file for complete search history.

(56) References Cited

U.S. PATENT DOCUMENTS 5,259,769 A * 11/1993 Cruise et al. ................. 439/65
6,010,370 A * 1/2000 Aihara et al. ............... 439/660
6,155,844 A * 12/2000 Semmeling et al. .......... 439/65
6,929,510 B1 * 8/2005 Pan ............................. 439/607
6,945,786 B1 * 9/2005 Ammar et al. ................ 439/65

FOREIGN PATENT DOCUMENTS

JP 06-310195 11/1994

* cited by examiner

*Primary Examiner*—Hae Moon Hyeon
(74) *Attorney, Agent, or Firm*—McDermott Will & Emery LLP

(57) ABSTRACT

The present invention includes a plurality of lead terminals made of a conductive material having spring elasticity; and insulative housing that buries a part of the region of lead terminal and fixedly retains a plurality of lead terminals in an arrangement having been set in advance. Lead terminal is composed of a buried part that is a part of lead terminal buried in housing; bottom end joint that is extended from one end of the buried part, is exposed through bottom end surface of housing, and extracted in width direction of bottom end surface; and flexibly changing part that is exposed from another end of the buried part through one wall surface orthogonal to bottom end surface, and is extended along this wall surface to top end surface facing to bottom end surface, being spaced from wall surface and top end surface.

15 Claims, 7 Drawing Sheets

BOARD CONNECTING COMPONENT AND THREE-DIMENSIONAL CONNECTING STRUCTURE USING THEREOF

BACKGROUND OF THE INVENTION

1. Field of the Invention

The present invention relates to a board connecting component (hereinafter, referred to as "board connector") that connects a plurality of boards mounting electronic parts such as semiconductor devices (hereinafter, referred to as "IC") and chip parts, and to a three-dimensional connecting structure using the board connector.

2. Background Art

Conventionally, a board connector for connecting between boards such as module boards mounting electronic parts such as ICs and chip parts uses a multi-contact connector composed of plug and socket parts, or a pin connector with a plurality of contact pins fixed through a resin spacer.

FIG. 10 is a sectional view showing a makeup in which two pieces of module boards 110 and 120 are connected by means of conventional pin connector 100. Pin connector 100 is composed of resin spacer 102; and a plurality of metal contact pins 104 fixed through this resin spacer 102. Meanwhile, module board 110 is formed with circuit pattern 114 on one surface of wiring board 112, and a given position of the circuit pattern 114 mounts electronic parts 116 such as chip parts and ICs thereon. In the same way, the other module board 120 is formed with circuit pattern 124 on one surface of wiring board 122, and a given position of the circuit pattern 124 mounts electronic parts 126 such as chip parts and ICs thereon.

Connection between module boards 110 and 120 using pin connector 100 is made as follows: That is, first position metal contact pin 104 of pin connector 100, with respective circuit patterns 114 and 124 of module boards 110 and 120. Next have the top and bottom ends of metal contact pin 104 penetrate respective circuit patterns 114 and 124. Then, join circuit pattern 114 and the bottom end of contact pin 104 together; and circuit pattern 124 and the top end of contact pin 104, respectively, at soldering joint 128 with solder. This completes connection between module boards 110 and 120 using pin connector 100.

Meanwhile, with reduction in size and weight and with higher functionality, of mobile devices and the like, the number of contact terminals between module boards tends to increase. Accordingly, a connector as a board connector needs to be smaller in area per one contact terminal, and thus the effort is being made to reduce the pitch of contact terminals of a pin connector.

However, in the connection method by a pin connector, a large stress is added to the joint of a pin connector with the difference in fluctuation in size due to temperature change between members composing the joint, or with an external impact force. Accordingly, a structure for absorbing such a stress is being studied.

Japanese Patent Unexamined Publication No. H06-310195, for example, shows the following connecting structure. That is, as a result that module boards 110 and 120 are connected together as shown in FIG. 12, using pin connector 130 as shown in FIGS. 11A and 11B, a stress due to thermal expansion of resin spacer 132 and others is absorbed. FIG. 11A is a plan view of the structure, and FIG. 11B is a sectional view of the structure as has been cut in a longitudinal direction. FIG. 12 is a sectional view showing a state in which module boards 110 and 120 are connected together using this pin connector 130.

A plurality of metal contact pins 134 vertically penetrating are insert molded and fixed to resin spacer 132 of this pin connector 130. Further, as shown in FIG. 11B, both the right and left ends of the bottom surface of pin connector 130 have flexible elastic piece 136 projecting obliquely downward.

As shown in FIG. 12, two pieces of module boards 110 and 120 are connected using this pin connector 130. The concrete procedure is as follows: That is, first have the top and bottom ends of metal contact pin 134 penetrate circuit patterns 114 and 124, respectively. Then, join the top end of contact pin 134 and circuit pattern 124; and the bottom end of contact pin 134 and circuit pattern 114, respectively, at soldering part 128 with solder. In this case, downside module board 110 is fixed so as to touch flexible elastic piece 136 on the bottom surface of resin spacer 132.

This makeup allows, even if resin spacer 132 of pin connector 130, and module boards 110 and 120 thermally expand due to heat generated by electronic parts 116 and 126 mounted on module boards 110 and 120, or the change in the ambient temperature, a stress generated thereby to be absorbed by flexible elastic piece 136. As a result, a stress is not added to soldering part 128 even if board connector 130 is heated by electronic parts 116 and 126 or the high ambient temperature, retaining a stable soldering condition. Here, flexible elastic piece 136 may be provided on the top surface of resin spacer 132, in addition to the bottom surface.

However, mobile devices have significantly higher functionality in recent years, further increasing the number of terminals of a connector, and strong devices against a drop impact and the like have been demanded as well. To cope with this matter, in the connecting structure with the above-mentioned pin connector, through-holes are provided on the module board, which is connected to the circuit pattern by having contact pins penetrate the through-holes, and a flexible elastic piece absorbs a heat stress as well. However, such a structure, although a thermal stress can be absorbed, disables circuit patterns or electronic parts to be implemented in a connection region and also makes it difficult to narrow the connection pitch.

An object of the present invention, for solving such a problem, is to provide a board connector capable of fine-pitch connection, with a highly reliable connection part against a drop impact and the like; and three-dimensional connecting structure using the board connector.

SUMMERY OF THE INVENTION

In order to achieve the above-mentioned object, a board connector according to the present invention includes:

a plurality of lead terminals made of a conductive material having spring elasticity; and an insulative housing that buries part of the lead terminals and fixedly retains the plurality of lead terminals in an arrangement having been set in advance, where a lead terminal has:

a buried part that is a part of the lead terminal buried in the housing;

a bottom end joint that extends from one end of the buried part, is exposed through the bottom end surface of the housing, and is extracted in width direction of the bottom end surface; and a flexibly changing part that is exposed from the other end of the buried part through one wall surface orthogonal to the bottom end surface, and extends along this wall surface to the top end surface facing to the bottom end surface, being spaced from the wall surface and top end surface.

This makeup facilitates elastic deformation of the flexibly changing part of the lead terminal, when joining two pieces of boards such as module boards, and this board connector. This results in absorbing an impact force by this flexibly changing part even if the external force is added. Further, respective boards do not need to provide through-holes for connecting between these boards. This makeup allows the lead terminals of the board connector and circuit patterns of the board connected to these lead terminals, to be formed in a fine pitch. Consequently, three-dimensional connecting structure with high reliability can be implemented that is capable of fine-pitch connection and does not cause damage in the joint and others, even if a large impact force such as a drop impact is added.

Bottom end joint may be formed in close contact with the bottom end surface of the housing. Further, the bottom end joint may be formed in close contact with the bottom end surface of the housing and additionally projecting in width direction of the bottom end surface, beyond the width of this bottom end surface. Such a makeup allows the bottom end joint to fixedly connect to the module board, facilitating connection when implementing a three-dimensional connecting structure using this board connector. Further, having the bottom end joint project in width direction of the bottom end surface of the housing allows a visual check of a condition of connection, facilitating inspection.

Moreover, the housing may be provided with a barrier for restricting the action of the flexibly changing parts on the wall surface between the flexibly changing parts of adjacent lead terminals. Alternatively, the housing may be provided with a recess on its wall surface, and a portion of the flexibly changing part may be allocated on the recess. In this way, as a result that a barrier or recess is provided, deformation of the flexibly changing part is restricted by means of the barrier or recess, even if a large impact force is added in arrangement direction of the lead terminals. Therefore, a short circuit due to contact of lead terminals can be prevented.

Meanwhile, the housing may have a shape of a polygonal frame, the flexibly changing part of the lead terminal may be exposed through the internal wall surface of the frame shape, and may be extended along the wall surface to the top end surface facing to the bottom end surface, being spaced from the wall surface and top end surface. With this makeup, when connecting between boards such as module boards with this board connector, a large area is involved for retaining, thus implementing both stable retention and improvement of impact resistance, in addition to facilitating increase of the number of lead terminals.

Further, the following makeup may be also accepted: That is, the external wall surface of the housing is formed with a conductive shield layer thereon, and the shield layer is connected to a grounding lead terminal provided at the same position as the bottom end joint of the lead terminal. Alternatively, the external wall surface of the housing is formed with a conductive shield layer thereon, and using at least one of the lead terminals as a grounding lead terminal, this grounding lead terminal is connected to the shield layer.

With such a makeup, the internal region of the board connector is electromagnetically shielded by the shield layer, and thus noise can be favorably suppressed if implementing electronic parts susceptible to external noise on this region of the module board.

Further, the surface of the shield layer may be covered with an insulating film. This makeup eliminates the change in electrical characteristic even if electronic parts and like accidentally contact the shield layer.

Still, the shield layer may be composed of a folded metal foil integrally molded with the housing. Alternatively, the shield layer may be composed of the housing surface coated with a conductive material. Such a makeup facilitates forming a shield layer.

A three-dimensional connecting structure according to the present invention includes the following components:

a first board;

a second board; and a board connector for electrically connecting the first board to the second board. The board connector has the following makeup: That is, in the circuit patterns formed on the first and second boards, the positions facing to the top and bottom end joints, respectively, join the top and bottom end joints.

This makeup implements a three-dimensional connecting structure with high shock resistance.

The board connector according to the present invention is provided with a flexibly changing part that exposes a plurality of lead terminals made of a conductive material having spring elasticity, through one of the wall surface of the housing, and extends these lead terminals along this wall surface to the top end surface, being spaced from the wall surface and top end surface. With this makeup, even if a large impact force such as an drop impact is added to the three-dimensional connecting structure joined with this board connector, this flexibly changing part absorbs the impact force, largely improving shock resistance. Consequently, in spite of fine-pitch connection, a three-dimensional connecting structure with high shock resistance can be implemented.

DETAILED DESCRIPTION OF THE INVENTION

Hereinafter, a description will be made for embodiments of the present invention, referring to drawings. Here, the same mark is given to the same element, and its description may be omitted.

First Embodiment

Figure 1:
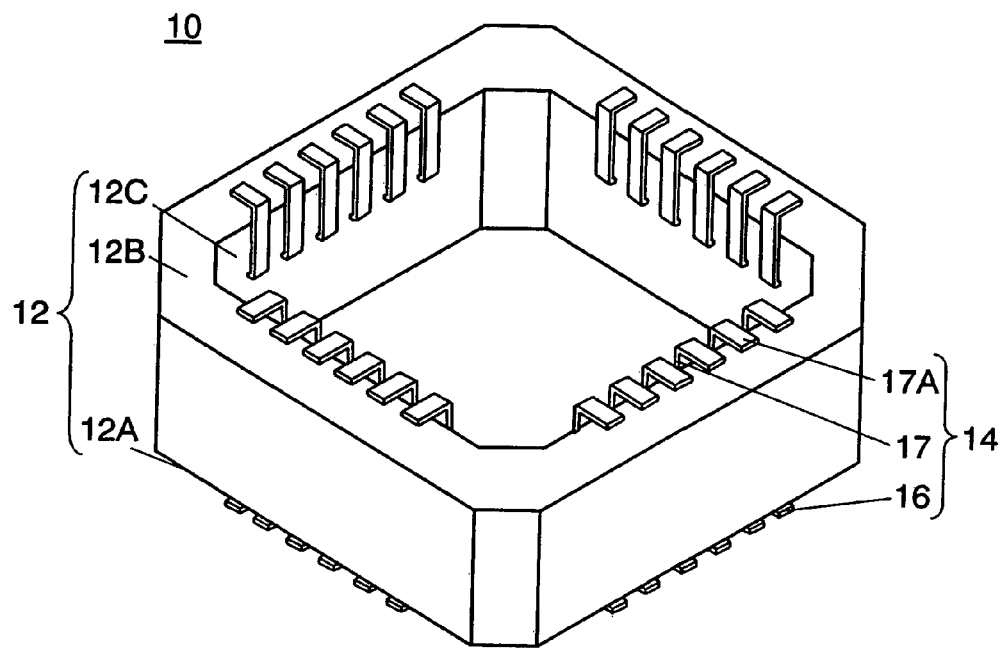
FIG. 1 is an external perspective view of a board connector according to the first embodiment of the present invention.
Figure 2:
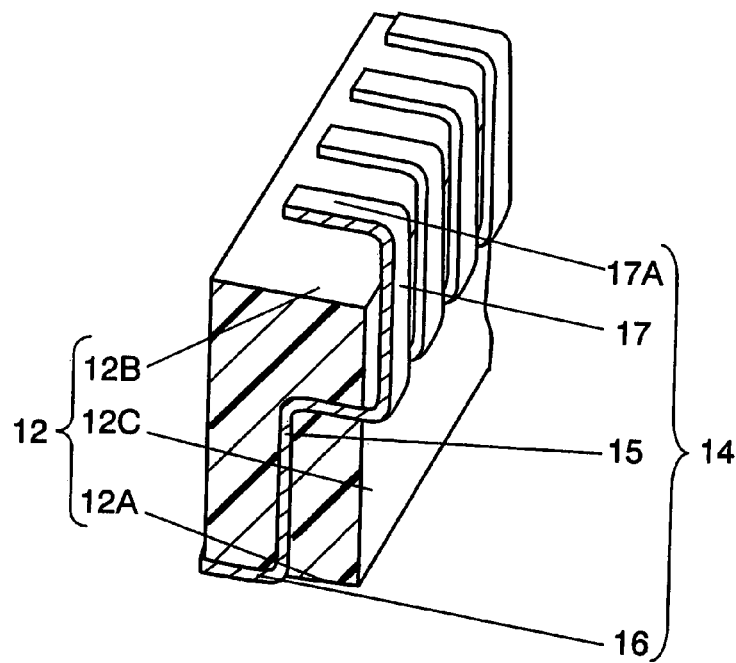
FIG. 2 is a perspective view of the cutaway substantial part for illustrating the structure of a lead terminal of the board connector according to the embodiment.

FIG. 1 is an external perspective view of board connector 10 according to the first embodiment of the present invention. FIG. 2 is a perspective view of the cutaway substantial part for illustrating the structure of lead terminal 14 of this board connector 10.

Housing 12, made of resin such as liquid crystal polymer, polyphenylene sulfide, or polybutylene terephthalate, has a shape of quadrangle frame with its four angles respectively chamfered, in this embodiment. Still, the cross section is a vertically long rectangle as shown in FIG. 2. Lead terminals 14, made of a thin metal plate with high spring elasticity, are allocated on housing 12 at a given pitch, and part of them are buried in housing 12 to be fixedly retained. These lead terminals 14, as shown in FIG. 2, are composed of buried part 15 buried in housing 12; bottom end joint 16 provided on housing 12, near bottom end surface 12A; and flexibly changing part 17 rising from around the central part of inner wall 12C of housing 12 along inner wall 12C, and is bent along top end surface 12B of housing 12. Here, in flexibly changing part 17, the region bent along top end surface 12B of housing 12 is to be top end joint 17A.

Buried part 15, substantially crank-shaped, is buried inside housing 12. One end of this buried part 15 is formed being exposed through bottom end surface 12A of housing 12, bent in width direction of bottom end surface 12A, and also in close contact with bottom end surface 12A. This part is to be bottom end joint 16. As shown in FIG. 1, this bottom end joint 16 partially projects beyond the external wall in width direction of bottom end surface 12A of housing 12.

Flexibly changing part 17 is extended from buried part 15 buried in housing 12, is exposed from around the central part of inner wall 12C of housing 12 to inner wall 12C, rises along inner wall 12C, and is bent along top end surface 12B of housing 12. Flexibly changing part 17 in the region of top end surface 12B is to be top end joint 17A as mentioned above. Still, flexibly changing part 17 is retained being spaced from inner wall 12C and top end surface 12B of housing 12, facilitating elastic deformation with an external force.

Board connector 10 according to the embodiment is composed as mentioned above, where top end joints 17A and bottom end joints 16 of a plurality of lead terminals 14 are located on substantially parallel flat surfaces, respectively, with which electrical and mechanical connection is made to circuit patterns on the respective boards.

Here, a material of this lead terminal 14 is desirably one with high spring elasticity, such as phosphorus blue copper, brass, white metal, beryllium copper, nickel alloy, stainless steel, or spring steel, where copper, nickel, and others can be also used. Meanwhile, the cross section of lead terminal 14 may be circular, as well as plain-plate-shaped as shown in FIG. 1. Further, an arrangement may be made so that elastic deformation will occur more easily, by making the width of flexibly changing part 17, excluding top end joint 17A, shorter than that of top end joint 17A, while keeping plain-plate-shaped as a whole. Moreover, it is sufficient if the width, thickness, and others of lead terminal 14 are appropriately set according to materials to be used and an arrangement pitch.

In addition, if lead terminals 14 connect to circuit patterns on respective boards by means of soldering, it is desirable to apply in advance a process for improving solderability in solder plating, gold plating, and others, at least on the surface of top end joint 17A and bottom end joint 16. Still, connection to circuit patterns may be made by means of a conductive adhesive. In this case, it is desirable to apply in advance a process such as gold plating on the surface, because the electric connection resistance can be reduced.

If a three-dimensional connecting structure is produced by joining boards together using board connector 10 of the embodiment, a drop impact and the like can be easily absorbed by flexibly changing part 17 of lead terminal 14.

Here, bottom end joint 16 of lead terminal 14 does not necessarily need to project through bottom end surface 12A of housing 12 in width direction. Still, in FIGS. 1 and 2, top end joint 17A is formed to be shorter than the width of top end surface 12B of housing 12. However, top end joint 17A may be formed so as to project in width direction of top end surface 12B.

Figure 3:
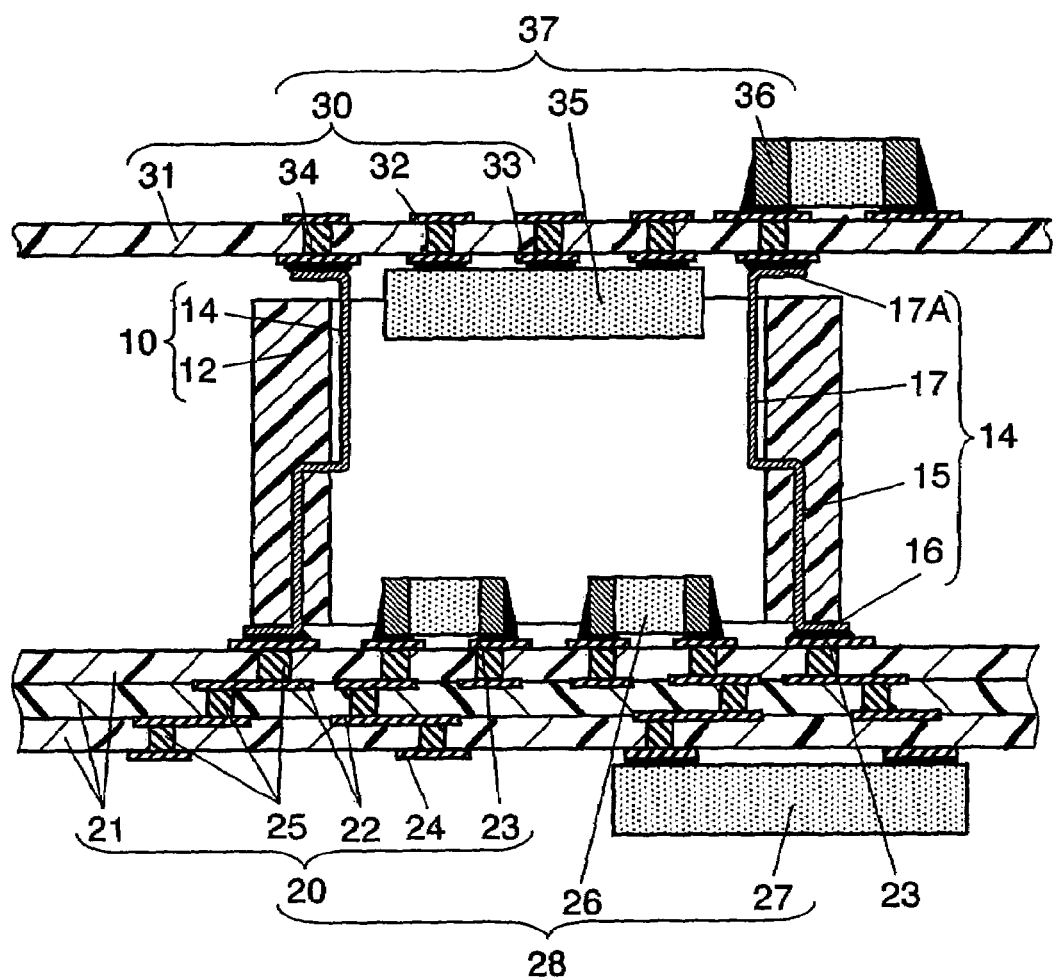
FIG. 3 is a sectional view of a three-dimensional connecting structure produced using the board connector according to the embodiment.

Next, a description will be made for a three-dimensional connecting structure in which boards are connected together using board connector 10 according to the embodiment, referring to FIG. 3. FIG. 3 is a sectional view of a three-dimensional connecting structure as has been cut off along the center line of board connector 10. Here, in this embodiment, a description will be made for the case where connection between boards implementing a plurality of electronic parts is made by means of this board connector 10, and thus the respective boards are hereinafter referred to as first module board 28 and second module board 37.

First module board 28 has a makeup in which electronic parts 26 and 27 such as ICs and chip parts are on board of multilayer wiring board 20 in this embodiment. Multilayer wiring board 20 is composed of a plurality of resin base materials 21, interlayer wiring pattern 22, circuit patterns 23 and 24 formed on both surfaces, and through conductor 25 connecting these components.

Meanwhile, second module board 37 has a makeup in which electronic parts 35 and 36 such as ICs and chip parts are on board of dual-sided wiring board 30 formed with wiring layer on both surfaces in this embodiment. Dual-sided wiring board 30 is composed of circuit patterns 32 and 33 formed on both sides of resin base material 31; and through conductor 34 connecting these components.

As a result that, in circuit pattern 23 formed on first module board 28 and in circuit pattern 33 formed on second module board 37, the positions facing to top end joint 17A and bottom end joint 16 of lead terminal 14 of board connector 10 join top end joint 17A and bottom end joint 16 with solder, a three-dimensional connecting structure can be implemented.

Here, if using board connector 10 according to the embodiment, electronic parts 26 and 35 can be mounted also in the region at inner wall 12C of board connector 10, on the respective surfaces of first module board 28 and second module board 37.

In the three-dimensional connecting structure shown in FIG. 3, circuit pattern 23 on first module board 28 joins bottom end joint 16 of board connector 10 with solder or the like. Bottom end joint 16 is formed in close contact with bottom end surface 12A of housing 12, and thus first module board 28 is fixed to board connector 10. Meanwhile, circuit pattern 33 on second module board 37 joins top end joint 17A of board connector 10 with solder or the like. However, flexibly changing part 17 of lead terminal 14 is retained being spaced from housing 12, and thus connection is made between second module board 37 and board connector 10 in a state where elastic deformation is possible.

With such a connecting structure, even if a large impact force such as a drop impact acts on this three-dimensional connecting structure, the impact force can be absorbed by elastic deformation of flexibly changing part 17 of lead terminal 14. Therefore, this makeup can prevent a defect in the joints between circuit pattern 23 of first module board 28 or circuit pattern 33 of second module board 37, and lead terminal 14. Consequently, a three-dimensional connecting structure with favorable impact resistance can be implemented.

Here, in the three-dimensional connecting structure in the embodiment, the first module board is a multilayer wiring board; and the second module board is a dual-sided wiring board. However, the present invention is not limited to this makeup. In other words, both boards may be either dual-sided or multilayer. Alternatively, one module board may be a flexible wiring board.

Figure 4:
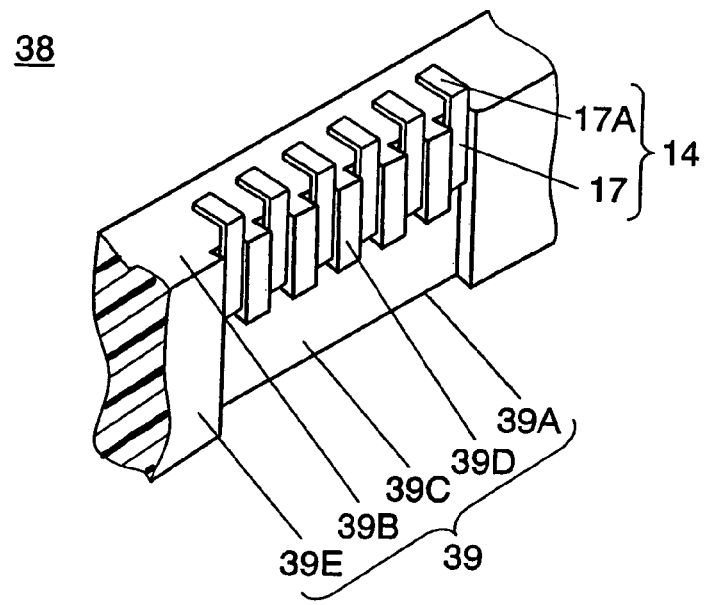
FIG. 4 is a partial perspective view of a lead terminal region for illustrating the structure of a first deformation example for the board connector according to the embodiment.

FIG. 4 is a partial perspective view of a lead terminal region for illustrating the structure of a first deformation example for the board connector according to the embodiment. Board connector 38 in this first deformation example partially differs from board connector 10 shown in FIG. 1 in shape of housing 39. That is, board connector 38 in the first deformation example is provided with barriers 39D and 39E between flexibly changing parts 17 of lead terminals 14 in housing 39, near inner wall 39C. Here, bottom end surface 39A and top end surface 39B in the region where lead terminal 14 is not provided are formed wider in width as compared to bottom end surface 39A and top end surface 39B of housing 39 where lead terminals 14 are provided.

With barriers 39D and 39E provided in this way, even if a large impact force acts in arrangement direction of lead terminals 14, deformation of flexibly changing part 17 is restricted by barriers 39D and 39E. This prevents a short due to contact of lead terminals 14. Here, the width between adjacent barriers 39D are set so that lead terminal 14 can elastically deform in case an impact force assumed in advance acts on the three-dimensional connecting structure.

Figure 5:
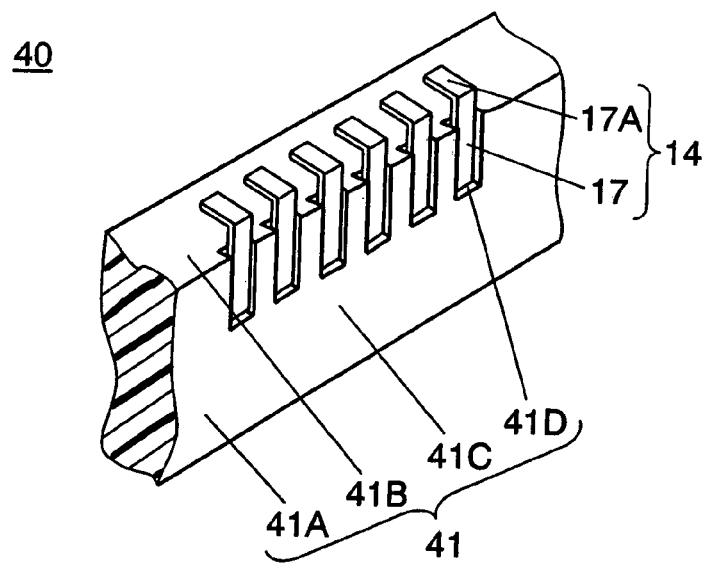
FIG. 5 is a partial perspective view a lead terminal region for illustrating the structure of a second deformation example for the board connector according to the embodiment.

FIG. 5 is a partial perspective view of the lead terminal region for illustrating the structure of a second deformation example for a board connector according to the embodiment. This board connector 40 in the second deformation example partially differs from board connector 10 shown in FIG. 1 in shape of housing 41. That is, board connector 40 in the second deformation example is provided with recess 41D on a part of inner wall 41C of housing 41, and flexibly changing parts 17 of lead terminals 14 are allocated in this recess 41D. Here, lead terminal 14 is provided with a bottom end joint (not illustrated) in close contact with top end joint 17A and bottom end surface 41A, on top end surface 41B of housing 41, where this structure is the same as that of board connector 10.

With recess 41D provided on inner wall 41C in this way, even if a large impact force acts in arrangement direction of lead terminals 14, deformation of flexibly changing part 17 is restricted by recess 41D. This prevents a short due to contact of lead terminals 14. Further, with flexibly changing part 17 allocated in recess 41D, even if electronic parts are on board of a module board in the region enclosed by inner wall 41C, these electronic parts are prevented from directly contacting the lead terminals. Therefore, as a result of using such a board connector, a defect such as a short due to contact of lead terminals and/or contact of a lead terminal and electronic parts can be prevented, while improving impact resistance. This allows a three-dimensional connecting structure with high reliability to be easily implemented.

Second Embodyment

Figure 6:
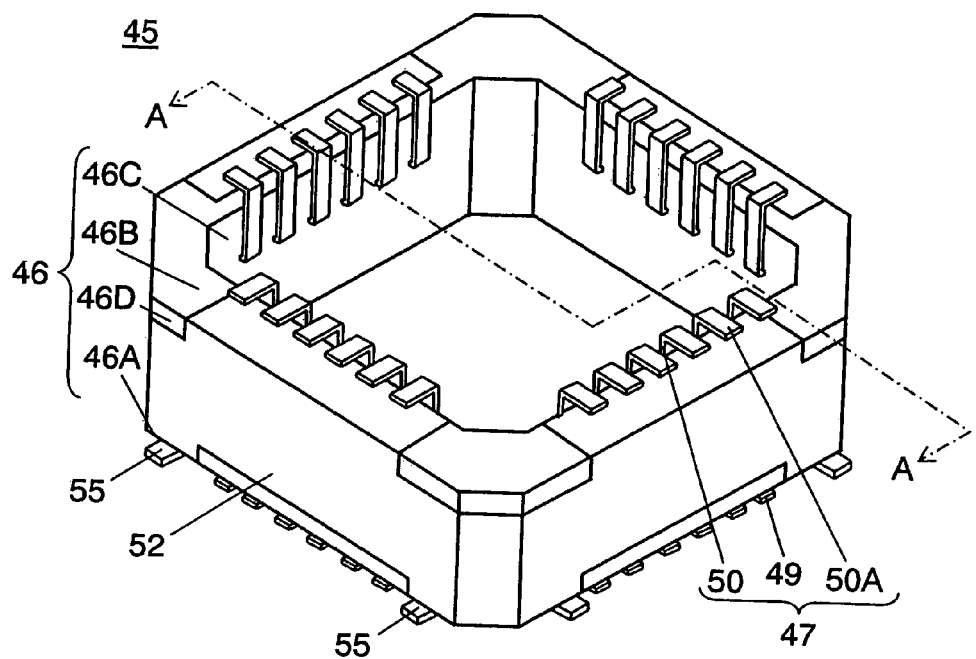
FIG. 6 is an external perspective view of a board connector according to the second embodiment of the present invention.
Figure 7:
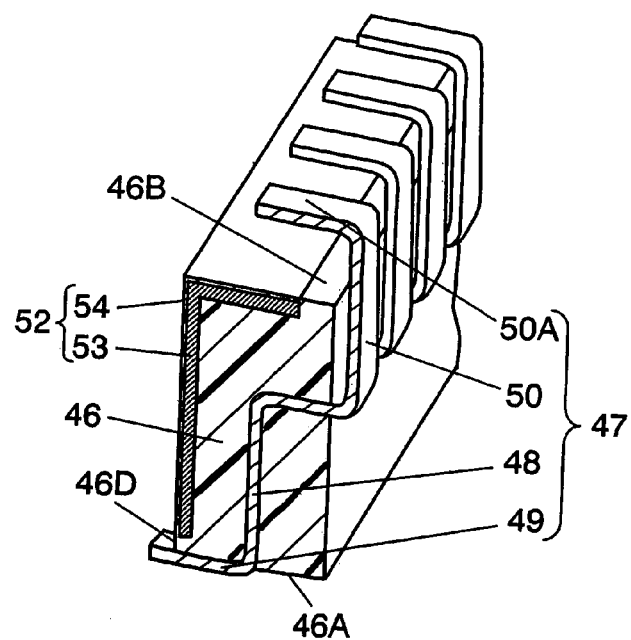
FIG. 7 is a perspective view of the cutaway substantial part for illustrating the structure of the lead terminal and shield layer of the board connector according to the embodiment.

FIG. 6 is an external perspective view of board connector 45 according to the second embodiment of the present invention. FIG. 7 is a perspective view of the cutaway substantial part for illustrating the structure of lead terminal 47 and shield layer 52 of this board connector 45.

The basic makeup of board connector 45 according to the embodiment is the same as that of board connector 10 described in the first embodiment. That is, housing 46, made of resin such as liquid crystal polymer, polyphenylene sulfide, or polybutylene terephthalate, has a shape of a quadrangle frame with its four angles respectively chamfered also in this embodiment. Still, the cross section is also a vertically long rectangle as shown in FIG. 7.

In the frame part of housing 46, lead terminals 47 made of a thin metal plate with high spring elasticity, are allocated at a given pitch, and part of them are buried in housing 46 to be fixedly retained. These lead terminals 47, as shown in FIG. 7, are composed of buried part 48 buried in housing 46; bottom end joint 49 provided on housing 46, near bottom end surface 46A; and flexibly changing part 50 rising from around the central part of inner wall 46C of housing 46 along inner wall 46C, and is bent along top end surface 46B of housing 46. Here, in flexibly changing part 50, the region bent along top end surface 46B of housing 46 is to be top end joint 50A.

Buried part 48, substantially crank-shaped, is buried inside housing 46. One end of this buried part 48 is exposed through bottom end surface 46A of housing 46, bent in close contact with itself in width direction of bottom end surface 46A, to form bottom end joint 49. As shown in FIG. 6, this bottom end joint 49 partially projects beyond the external wall 46D of housing 46.

Flexibly changing part 50 is extended from buried part 48 buried in housing 46, is exposed through around the central part of inner wall 46C of housing 46 to inner wall 46C, rises along inner wall 46C, and is bent along top end surface 46B of housing 12. Flexibly changing part 50 in the region of top end surface 46B is to be top end joint 50A as mentioned above. Still, flexibly changing part 50 is retained being spaced from inner wall 46C and top end surface 46B of housing 46, facilitating elastic deformation with an external force.

As mentioned above, the makeup thus far is the same as that of board connector 10 in the first embodiment. Board connector 45 in this embodiment is further provided with shield layer 52 on the surface of external wall 46D and top end surface 46B of housing 46.

This shield layer 52, while covering external wall 46D of housing 46, is also formed on top end surface 46B. In this embodiment, shield layer 52 uses metal foil 53 such as copper foil and is integrally molded with housing 46. In other words, shield layer 52 has a folded shape so as to cover external wall 46D as well as top end surface 46B of housing 46, and is integrally molded with housing 46. This makeup allows shield layer 52 and housing 46 to integrally join each other while improving an electromagnetic shielding function.

Here, shield layer 52 electrically connects to grounding lead terminal 55 formed at both ends of the region provided with lead terminal 47, on bottom end surface 46A of housing 46. In FIG. 6, two pieces of grounding lead terminals 55 are provided each on bottom end surface 46A of housing 46, in a region of external wall 46D where lead terminals 47 are formed. However, all grounding lead terminals 55 do not need to be electrically connected to shield layer 52, but at least one grounding lead terminal 55 needs to be connected.

Figure 8:
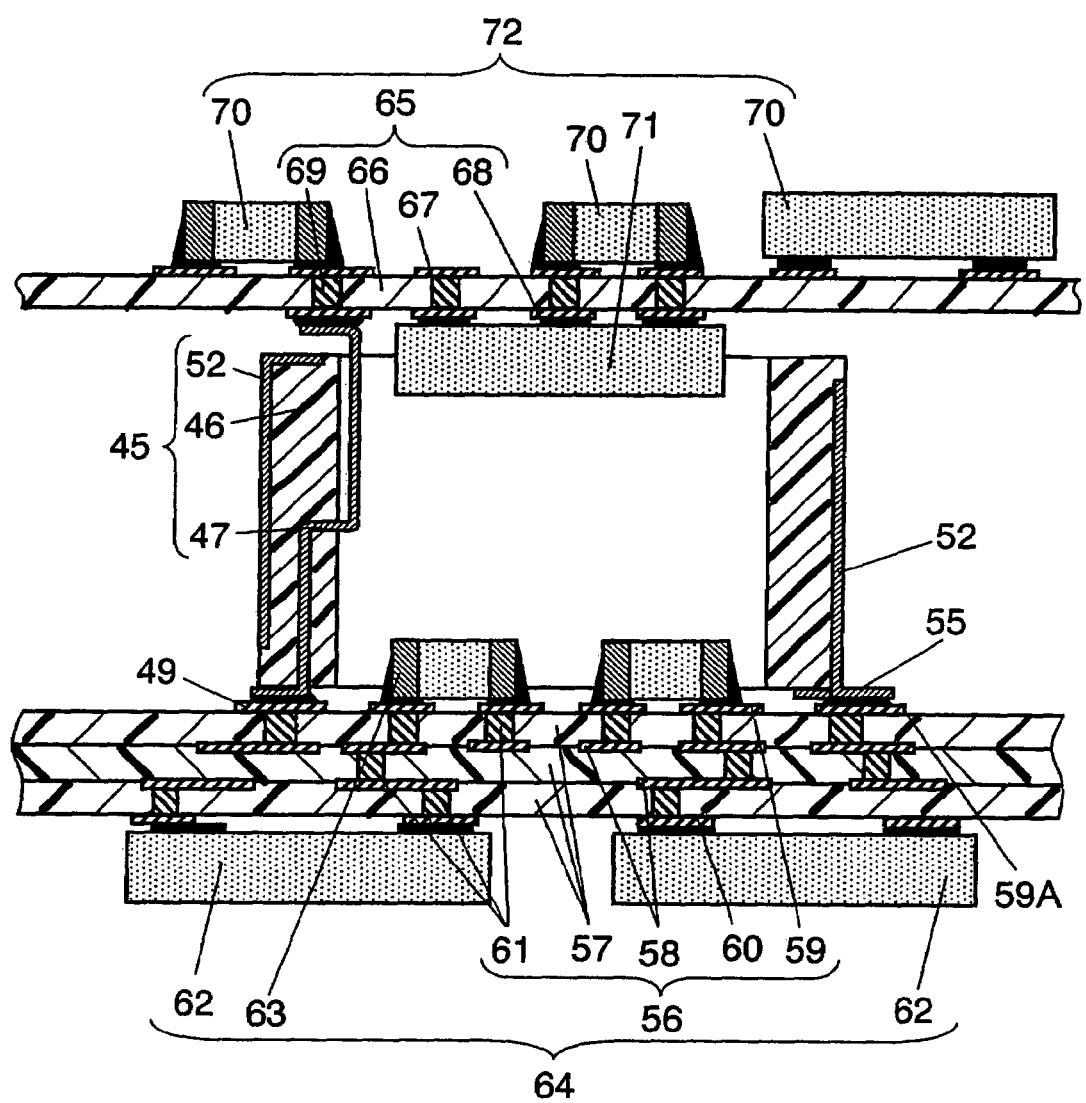
FIG. 8 is a sectional view of a three-dimensional connecting structure produced using a board connector according to the embodiment, where the structure is cut off along line A—A shown in FIG. 6 with reference to the board connector.

Next, a description will be made for a three-dimensional connecting structure in which boards are connected together using board connector 45 according to the embodiment, referring to FIG. 8. FIG. 8 is a sectional view of a three-dimensional connecting structure using board connector 45 in the embodiment, where the structure is as have been cut off along line A—A shown in FIG. 6 with reference to board connector 45. Here, also in this embodiment, a description will be made for the case where connection is made between boards on which a plurality of electronic parts are implemented, by means of this board connector 10, and thus the respective boards are referred to as first module board 64 and second module board 72 hereinafter.

First module board 64 has a makeup in which electronic parts 62 and 63 such as ICs and chip parts are on board of multilayer wiring board 56 in this embodiment. Multilayer wiring board 56 is composed of a plurality of resin base materials 57, interlayer wiring pattern 58, circuit patterns 59 and 60 formed on both surfaces, and through conductor 61 connecting these components.

Meanwhile, second module board 72 has a makeup in which electronic parts 70 and 71 such as ICs and chip parts are on board of dual-sided wiring board 65 formed with wiring layers on both sides in this embodiment. Dual-sided wiring board 65 is composed of circuit patterns 67 and 68 formed on both sides of resin base material 66, and through conductor 69 connecting these components.

Join the positions facing to top end joint 50A and bottom end joint 49 of lead terminal 47 of board connector 45, and top end joint 50A and bottom end joint 49, in circuit pattern 59 formed on first module board 64 and in circuit pattern 68 formed on second module board 72, with solder. Further, join grounding lead terminal 55 connected to both grounding contact terminal 59A and shield layer 52, in circuit pattern 59 on first module board 64, with solder. As a result of this joining, a three-dimensional connecting structure can be achieved in which first module board 64 and second module board 72 are connected electrically and mechanically.

Additionally, in the three-dimensional connecting structure according to the embodiment, an electromagnetic shielding function is available in a region enclosed by inner wall 46C of board connector 45 by means of shield layer 52 provided on external wall 46D and top end surface 46B of board connector 45. Here, lead terminal 47, almost all part of which is covered with shield layer 52, has an electromagnetic shielding function for itself.

Therefore, if electronic parts susceptible to external noise are mounted in the region near inner wall 46C of board connector 45, on the respective surfaces of first module board 64 and second module board 72, a three-dimensional connecting structure with high noise immunity can be implemented.

Meanwhile, even if a large impact force such as a drop impact acts on this three-dimensional connecting structure, the impact force can be absorbed by elastic deformation of flexibly changing part 50 of lead terminal 47. Therefore, this makeup can prevent breakage of lead terminal 47, and a defect in the joints between circuit pattern 59 of first module board 64 or circuit pattern 68 of second module board 72, and lead terminal 47. Such effects are the same as the case of three-dimensional connecting structure in the first embodiment.

Figure 9:
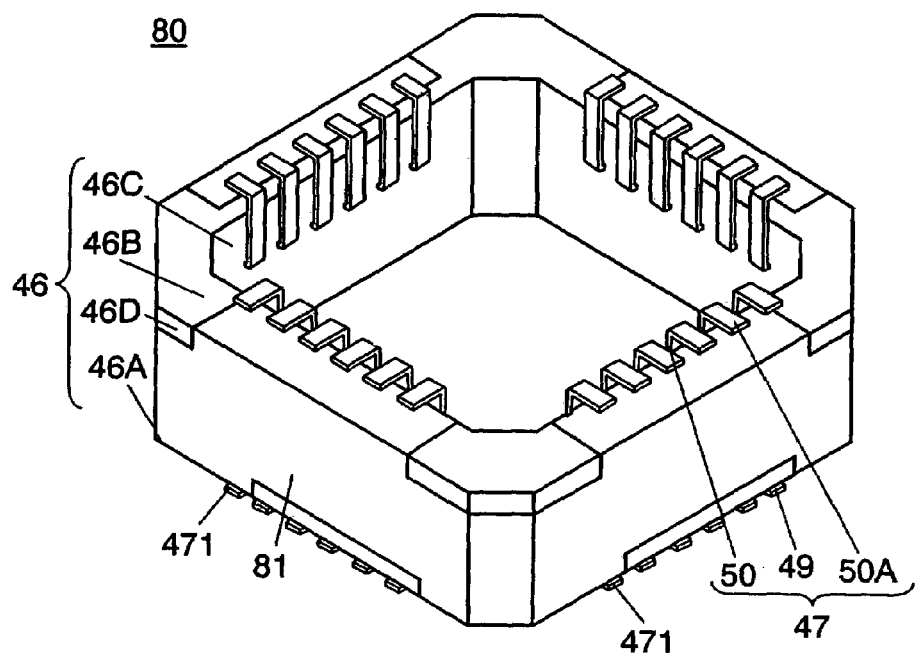
FIG. 9 is an external perspective view showing a deformation example for a board connector according to the embodiment.
Figure 10:
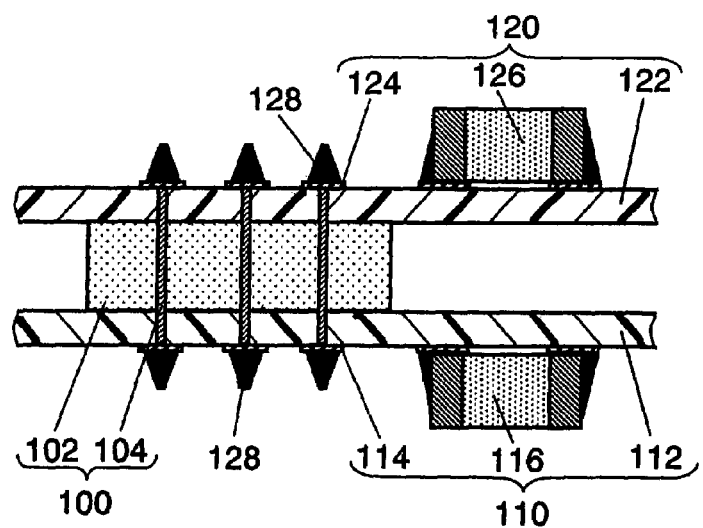
FIG. 10 is a sectional view showing the makeup in which connection between module boards is made with pin connectors, which is a conventional method.
Figure 11A:
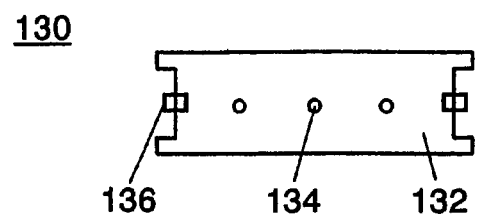
FIG. 11A is a plan view of a pin connector in another conventional method.
Figure 11B:
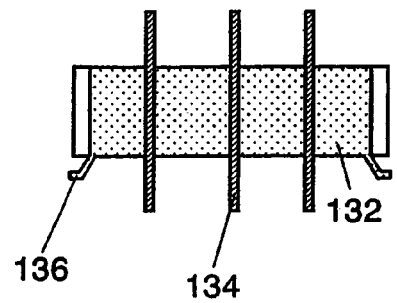
FIG. 11B is a longitudinal sectional view of the pin connector shown in FIG. 11A.
Figure 12:
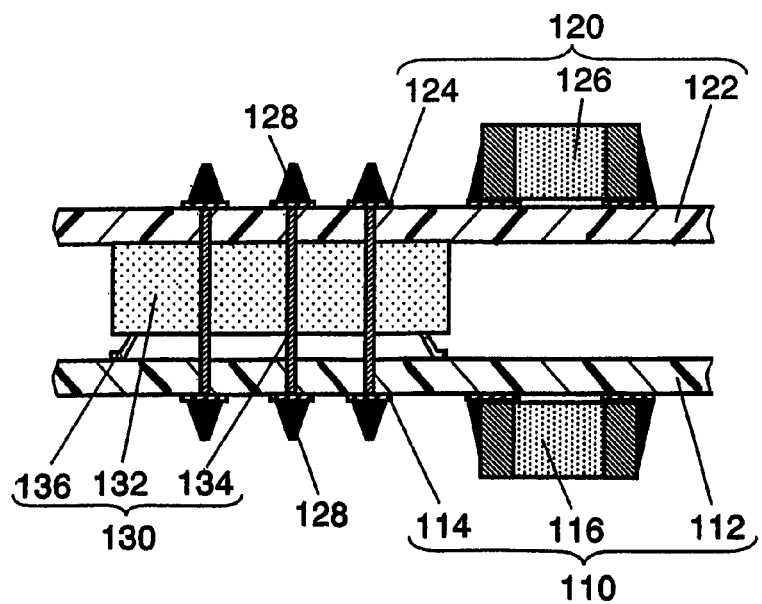
FIG. 12 is a sectional view showing the makeup in which connection of module boards together is made with the pin connector shown in FIGS. 11A and 11B.

Here, in this embodiment, shield layer 52 of board connector 45, allocating grounding lead terminals 55 at both ends of the region where lead terminals 47 are provided, is connected to this grounding lead terminal 55. However, the present invention is not limited to this makeup. FIG. 9 is an external perspective view showing a deformation example for the board connector according to the embodiment. As shown in FIG. 9, using one of lead terminals 47 as grounding lead terminal 471, shield layer 81 may be extended to bottom end surface 46A of housing 46 to connect to this grounding lead terminal 471.

When connecting module boards together using such a board connector 80, grounding lead terminal 471 connected to shield layer 81 can connect to first module board and/or second module board. Accordingly, ground connection of shield layer 81 becomes easier. Further, for the first and second module boards, a shielded electrode can be formed on the surface facing to the housing region of board connector 80, and the shielded electrode can be connected to shield layer 81 through grounding lead terminal 471. With such a connection, the electromagnetic shielding function in the region enclosed by board connector 80 can be further improved.

Here, in the three-dimensional connecting structure according to the embodiment, the first module board is a multilayer wiring board, and the second module board is a dual-sided wiring board. However, the present invention is not limited to this combination. That is, both may be dual-sided or multilayer. Alternatively, one module board may be a flexible wiring board. Still, the module board has circuit patterns formed on its resin base material. However, the present invention is not limited to a resin base material, where instead, a metal base material formed with a porcelain enamel substrate or an insulating film may be used, for example.

Moreover, in the board connector according to the embodiment, the shape of the housing may be one in the first or second deformation example shown in FIG. 4 or 5.

Further, in the first and second embodiments, the housing of the board connector is frame-shaped substantially quadrangle. However, the present invention is not limited to this shape. For example, it may be an annular shape and lead terminals are arranged on the annular part at a given pitch. Alternatively, a pentagon or rectangle frame shape may be used. Still, the housing may be a merely rectangular solid and lead terminals may be arranged in a straight line.

Meanwhile, the lead distal end of the board connector is connected to circuit patterns on the module board by means of solder, where instead, a conductive adhesive may be used.

A board connector of the present invention and a three-dimensional connecting structure using the member, enable connecting between boards with electronic parts implemented thereon in a fine pitch, largely improving impact resistance. Further, as a result that a shielding function can be added, electronic parts susceptible to electromagnetic noise can be electromagnetically shielded, which is especially useful for portable electronic devices such as a mobile device.

What is claimed is:

1. A board connecting component, comprising:
   a plurality of lead terminals made of a conductive material having spring elasticity; and
   an insulative housing with a polygonal frame-like shape that buries a part of the lead terminal and fixedly retains the plurality of lead terminals in an arrangement having been set in advance,
   wherein the lead terminal includes:
      a buried part that is a part of the lead terminal buried in the housing;
      a bottom end joint that is extended from one end of the buried part, is exposed through a bottom end surface of the housing, and is extracted in width direction of the bottom end surface; and
      a flexibly changing part that is exposed from an other end of the buried part through one wall surface orthogonal to the bottom end surface, and is extended along the wall surface to a top end surface facing to the bottom end surface, being spaced from the wall surface and the top end surfaced
   wherein a region along said top end surface of said housing forms a top end joint in said flexibly changing part, and
   wherein said top end joint is a flat plane.

2. The board connecting component according to claim 1, wherein the bottom end joint is formed in close contact with the bottom end surface of the housing.

3. The board connecting component according to claim 1, wherein
   the bottom end joint is formed in close contact with the bottom end surface on a bottom end surface part of the housing, and projects beyond width of the bottom end surface in width direction of the bottom end surface.

4. The board connecting component according to claim 1, wherein
   the housing is provided with a barrier that restricts an action of the flexibly changing part, on the wall surface between the flexibly changing parts of the adjacent lead terminals.

5. The board connecting component according to claim 1, wherein
   the housing is provided with a recess on the wall surface, and the flexibly changing part is allocated at the recess.

6. The board connecting component according to claim 1, wherein the flexibly changing part of the lead terminal is exposed through an internal wall surface of the frame-like shape and is extended along the wall surface to the top end surface facing the bottom end surface, being spaced from the wall surface and the top end surface.

7. The board connecting component according to claim 6, wherein
   an external wall surface of the housing is formed with a conductive shield layer thereon; and
   wherein the shield layer is connected to a grounding lead terminal provided at a same position as the bottom end joint of the lead terminal.

8. The board connecting component according to claim 6, wherein
   an external wall surface of the housing is formed with a conductive shield layer thereon, and using at least one of the lead terminals as a grounding lead terminal, the grounding lead terminal is connected to the shield layer.

9. The board connecting component according to claim 7, wherein
   a surface of the shield layer is covered with an insulative film.

10. The board connecting component according to claim 8, wherein
    a surface of the shield layer is covered with an insulative film.

11. The board connecting component according to claim 7, wherein
    the shield layer is composed of a folded metal foil integrally molded with the housing.

12. The board connecting component according to claim 8, wherein
    the shield layer is composed of a folded metal foil integrally molded with the housing.

13. The board connecting component according to claim 7, wherein
    the shield layer is composed of the housing surface coated with a conductive material.

14. The board connecting component according to claim 8, wherein
    the shield layer is composed of the housing surface coated with a conductive material.

15. A three-dimensional connecting structure, comprising:
    a first board;
    a second board; and
    a board connector that electrically connects the first board to the second board, wherein positions facing to a top end joint and a bottom end joint of a lead terminal of the board connector, respectively, in a circuit pattern formed on the first board and a circuit pattern formed on the second board, join the top end joint and the bottom end joint; and wherein the board connector includes:
    a plurality of lead terminals made of a conductive material having spring elasticity; and
    an insulative housing with a polygonal frame-like shape that buries a part of the region of the lead terminal and fixedly retains a plurality of the lead terminals in an arrangement having been set in advance, wherein the lead terminal has:
    a buried part that is a part of the lead terminal buried in the housing;
    a bottom end joint that is extended from one end of the buried part, is exposed through a bottom end surface of the housing, and is extracted in width direction of the bottom end surface; and
    a flexibly changing part that is exposed from an other end of the buried part through one wall surface orthogonal to the bottom end surface, and is extended along the wall surface to a top end surface facing to the bottom end surface, being spaced from the wall surface and the top end surface,
    wherein a region along said top end surface of said housing forms said top end joint in said flexibly changing part and
    wherein said top end joint is a flat plane.

* * * * *